United States Patent
Lee et al.

(10) Patent No.: US 6,660,585 B1
(45) Date of Patent: Dec. 9, 2003

(54) STACKED GATE FLASH MEMORY CELL WITH REDUCED DISTURB CONDITIONS

(75) Inventors: Peter W. Lee, Saratoga, CA (US); Hsing-Ya Tsao, Santa Clara, CA (US); Vei-Han Chan, San Jose, CA (US); Hung-Sheng Chen, San Jose, CA (US); Fu-Chang Hsu, San Jose, CA (US)

(73) Assignee: Aplus Flash Technology, Inc., Santa Clara, CA (US)

( * ) Notice: Subject to any disclaimer, the term of this patent is extended or adjusted under 35 U.S.C. 154(b) by 0 days.

(21) Appl. No.: 09/531,787

(22) Filed: Mar. 21, 2000

(51) Int. Cl.[7] .............................................. H01L 21/336
(52) U.S. Cl. ....................... 438/257; 438/287; 438/593; 438/303; 438/305
(58) Field of Search ................................ 438/257, 258, 438/593, 594, 287, 301, 302, 303, 305

(56) References Cited

U.S. PATENT DOCUMENTS

| | | | |
|---|---|---|---|
| 5,019,527 A | * 5/1991 | Ohshima et al. ............ | 438/257 |
| 5,079,603 A | * 1/1992 | Komori et al. .............. | 257/316 |
| 5,168,465 A | 12/1992 | Harari ........................ | 257/320 |
| 5,172,200 A | 12/1992 | Muragishi et al. .......... | 257/315 |
| 5,194,929 A | * 3/1993 | Ohshima et al. ............ | 257/326 |
| 5,300,802 A | * 4/1994 | Komori et al. ......... | 365/185.33 |
| 5,345,104 A | * 9/1994 | Prall et al. ................... | 257/607 |
| 5,479,036 A | 12/1995 | Hong ......................... | 257/315 |
| 5,534,455 A | * 7/1996 | Liu ............................. | 438/263 |
| 5,654,917 A | 8/1997 | Ogura et al. ........... | 365/185.18 |
| 5,674,764 A | * 10/1997 | Liu et al. .................... | 438/257 |
| 5,759,896 A | * 6/1998 | Hsu ............................ | 438/264 |
| 5,783,457 A | * 7/1998 | Hsu ............................ | 438/302 |
| 5,792,670 A | * 8/1998 | Pio et al. .................... | 438/257 |
| 5,880,991 A | 3/1999 | Hsu et al. ................... | 365/182 |
| 5,882,970 A | * 3/1999 | Lin et al. .................... | 438/264 |
| 5,920,776 A | * 7/1999 | Fratin et al. ................ | 438/257 |
| 6,284,603 B1 | * 9/2001 | Ho Simon et al. .......... | 438/264 |
| 6,303,454 B1 | * 10/2001 | Yeh et al. ................... | 438/305 |
| 6,330,187 B1 | * 12/2001 | Choi et al. ............. | 365/185.15 |
| 6,346,441 B1 | * 2/2002 | Hsu ............................ | 438/257 |

OTHER PUBLICATIONS

Wolf et al., "Hot–Carrier–Resistant Processing and Device Structures", Siicon Processing for the VLSI Era—vol. 3: The Submicron MOSFET, Lattice Press (1995), pp. 595–598.*

* cited by examiner

*Primary Examiner*—Stephen D. Meier
*Assistant Examiner*—Toniae M. Thomas
(74) *Attorney, Agent, or Firm*—George O. Saile; Stephen B Ackerman

(57) ABSTRACT

In this invention a stacked gate flash memory cell is disclosed which has a lightly doped drain (LDD) on the drain side of the device and uses the source to both program using hot electron generation and erase the floating gate using Fowler-Nordheim-tunneling. Disturb conditions are reduced by taking advantage of the LDD and the biasing of the cell that uses the source for both programming and erasure. The electric field of the drain is greatly reduced as a result of the LDD which reduces hot electron generation. The LDD also helps reduce bit line disturb conditions during programming. A transient bit line disturb condition in a non-selected cell is minimized by preconditioning the bit line to the non-selected cell to Vcc.

1 Claim, 4 Drawing Sheets

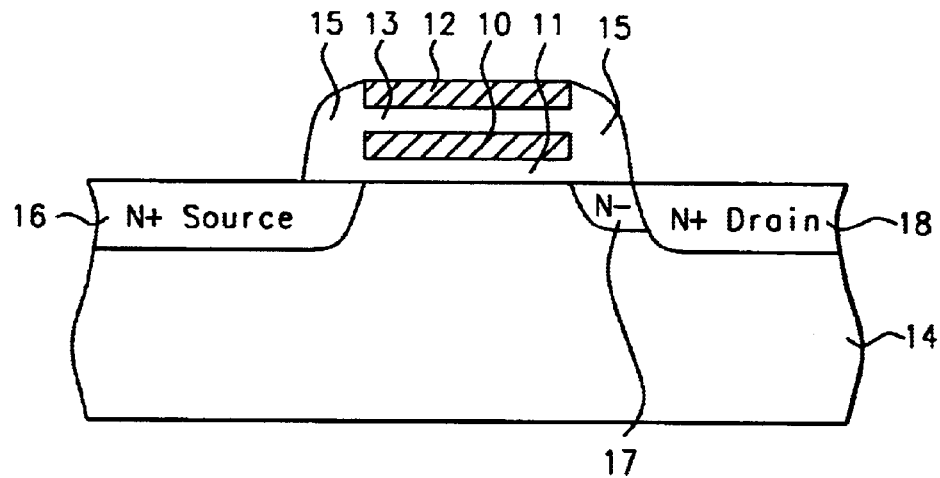
*FIG. 1*
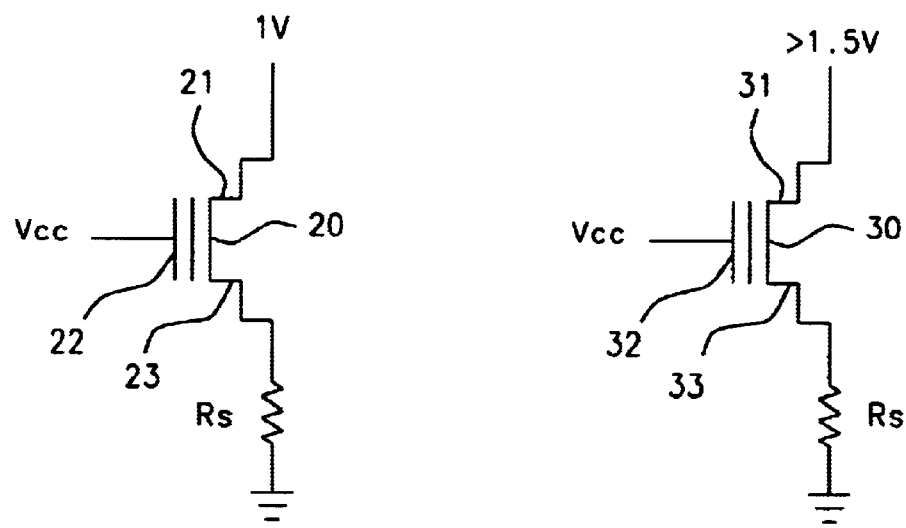
*FIG. 2a*
*Prior Art*
*FIG. 2b*

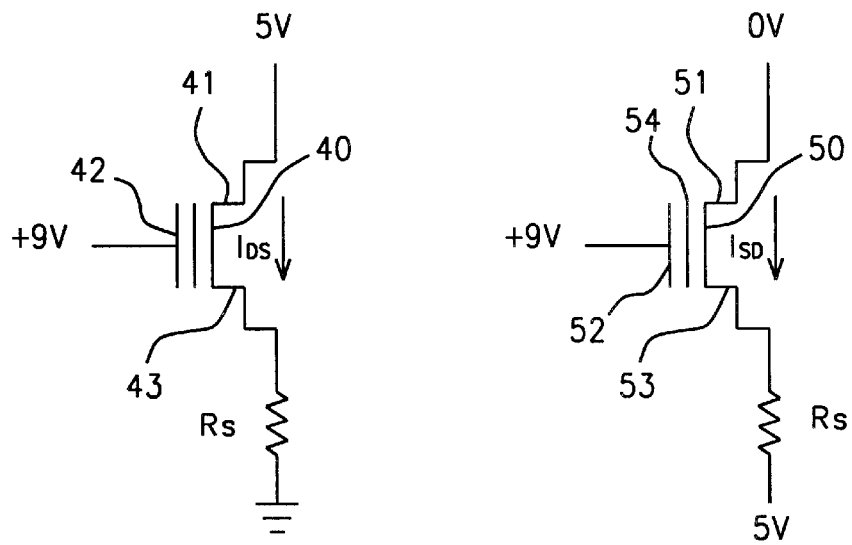
*FIG. 3a*
*Prior Art*
*FIG. 3b*
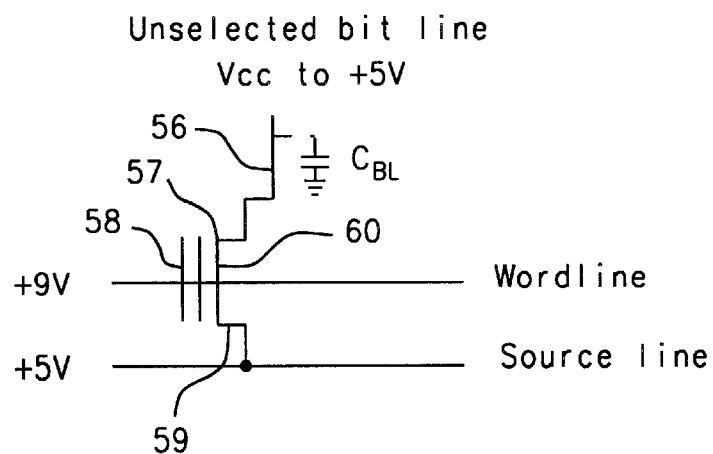
*FIG. 4*

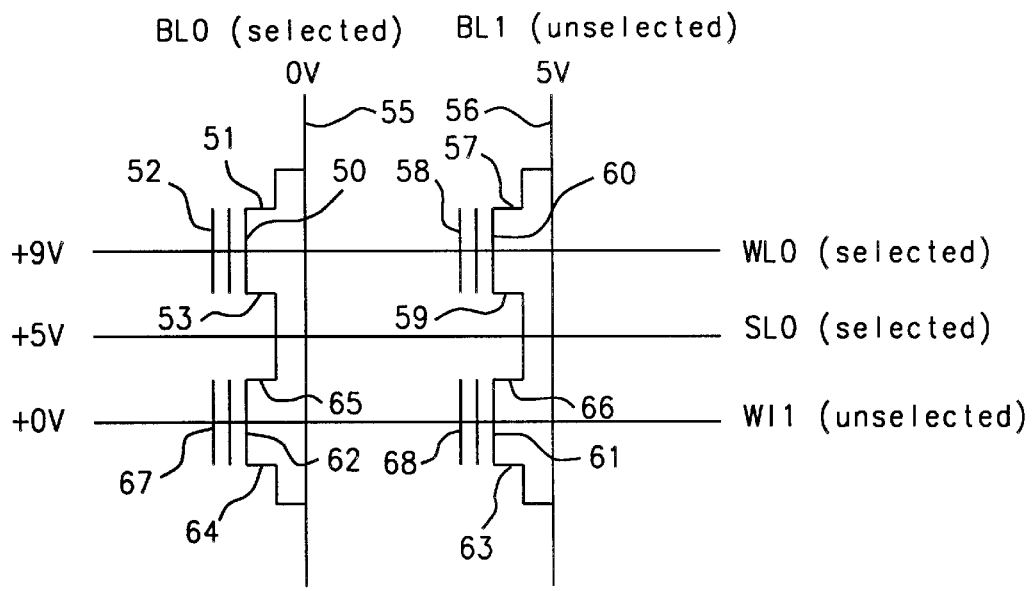
FIG. 5
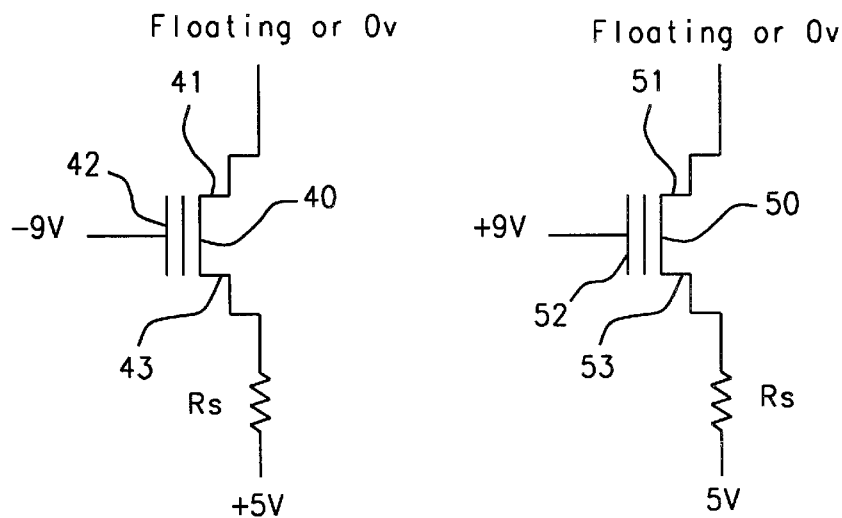
FIG. 6a
Prior Art
FIG. 6b

STACKED GATE FLASH MEMORY CELL WITH REDUCED DISTURB CONDITIONS

BACKGROUND OF THE INVENTION

1. Field of Invention

This invention relates to semiconductor memories and in particular flash memory cells.

2. Description of Related Art

One of the problems associated with a flash memory is bit line and word line disturbs which are caused by bit line and word line voltages being coupled to the deselected cells as well as the selected cells on the same bit line or word line during erase, program and read operations. The effect of the bit line and word line disturb is to change the threshold voltage of the disturbed cells. This is an accumulative effect that over time will cause a memory error, will shorten the program and erase cycles, and reduce product life.

In U.S. Pat. No. 5,880,991 (Hsu et al.) is described an integration of a flash EEPROM with a DRAM and an SRAM on the same chip. The process to form the floating gate incorporates the process for making a stacked capacitor for the DRAM. In U.S. Pat. No. 5,654,917 (Ogura et al.) a process is described for fabricating a flash memory array. The embedded structure of the flash memory cells are used in a Domino and Skippy Domino schemes to program and read the cells. In U.S. Pat. No. 5,479,036 (Hong et al.) a structure and process is described for a split gate flash memory cell. The process utilizes self aligned techniques to produce an array of flash memory cells. In U.S. Pat. No. 5,172,200 (Muragishi et al.) an EEPROM flash memory cell is described which utilizes a lightly doped drain structure for both the drain and the source. An insulating layer with a protruding "visor like" shape is used to improve the resistance of the insulating layer to destruction caused by high electric fields. In U.S. Pat. No. 5,168,465 (Harari) a split channel and other cell configurations are used to produce an EEPROM. The elements of the EEPROM are produced using a cooperative process of manufacture to provide self alignment. A programming technique allows each memory cell to store more than one bit of information.

Bit line and wordline disturb conditions occur in memory arrays that use stacked gate cells. This can occur during programming and reading when a combination of voltages must be applied to a particular stacked gate cell but also extend to other cells that are deselected. A disturb condition also occurs during erasure of a column of cells where word lines for the cells in the column are at a high negative potential and extend to other cells in other columns that are deselected and inhibited for erasure. Although a particular operation (read, program or erase) are not carried out in the other cells that are inhibited, the bias on a bit line or a word line extends to the other cells that are inhibited and can reduce the charge on the floating gates of those cells, albeit at a slow rate. The charge on the floating gate of a stacked gate cell determines the threshold voltage which determines the logical value of the stored data in the cell. The charge can be reduced over time from repeated disturb operations until the threshold voltage of the stacked gate drops below a point where the stored value is in error.

SUMMARY OF THE INVENTION

In this invention a stacked gate flash memory cell and its usage is described to produce reduced disturb conditions. A control gate is stacked on top of a floating gate separated by an insulator such as an oxide. A lightly doped drain is implanted on the drain side of the stacked gates and a heavily doped source is implanted on the source side of the stacked gates. Sidewalls are formed on the sides of the stacked gates, and after the sidewalls are formed a heavily doped drain is implanted into the semiconductor substrate. The heavily doped drain forms a contact region with the lightly doped drain which was implanted previous to the forming of the sidewalls.

The source in the present invention is used to both program the flash memory cell by means of hot electrons and to erase the memory cell by using Fowler-Nordheim tunneling. The lightly doped drain (LDD) greatly reduces the electric field at the drain, reducing the hot electron generation and as a result reducing bit line disturbs during programming. Other techniques, such as double diffused drain and large angle tilted implanted drain, can be used to produce the effects of the LDD to reduce the electric field and reduce the hot electron generation at the drain. Depending upon product requirements such as increased breakdown and reduced band to band tunneling a double diffused source can be used in place of a heavily doped arsenic source.

During an erase operation the present stacked gate flash memory cell is biased similar to prior art with the selected bit lines connected to the drain either floating or connected to zero volts while the source through the selected source line is connected to +5V and the control gate connected to the selected wordline is biased to −9V. Unselected wordlines connected to gates of unselected cells are biased to 0V during an erase operation.

During programming of the present flash memory cell, a selected wordline connected to a number of gates is biased to +9V while the selected source line is connected to +5V. The selected source line applies the +5V bias to the gates connected to the selected wordline as well as gates connected to wordlines that are not selected. The drain of the transistor of the cell that is being programmed is biased to 0V through a selected bit line. Unselected bit lines connected to drains of cells not being programmed are pre-biased to Vcc and then biased to +5V to minimize the effects of a transient soft program disturb. The transient soft program disturb occurs in cells connected to both selected wordlines at +9V and selected source lines at +5V. When an unselected bit line is raised to +5V a transient current can flow through the cell which causes a disturb condition. To minimize this effect the unselected bit lines are pre-charged to Vcc which reduces the bit line charging voltage (+5V−Vcc). The +5V bias on unselected bit lines will cause a bit line disturb in cell connected to unselected wordlines. This disturb condition is minimized by the design of the drain that is lightly doped at the drain side of the channel which greatly reduces hot electron generation.

During a read the gate of the memory cell being read is connected to Vcc through a word line, the source is connected to 0V through the source line and the drain is connected to +1.5V through a bit line. A soft read disturb is not a concern because of the LDD structure and the higher drain voltage can be used compared to +1V in prior art.

BRIEF DESCRIPTION OF THE DRAWINGS

This invention will be described with reference to the accompanying drawings, wherein:

FIG. 1 is a cross sectional view of the stacked gate flash memory cell of this invention, FIG. 2a is a schematic of a stacked gate flash memory cell of prior art biased in a read mode, FIG. 2b is a schematic of the stacked gate flash memory cell of this invention biased in the read mode, FIG. 3a is a schematic of a stacked gate flash memory cell of prior art biased in a program mode, FIG. 3b is a schematic of the stacked gate flash memory cell of this invention biased in the program mode, FIG. 4 is a schematic diagram of the stacked gate flash memory cell of this invention biased in a unselected state during programming of another cell along the same wordline, FIG. 5 is a schematic diagram showing the cells of this invention in a matrix biased in the selected and unselected state, FIG. 6a is a schematic of a stacked gate flash memory cell of prior art biased in an erase mode, FIG. 6b is a schematic of a stacked gate flash memory cell of this invention biased in the erase mode.

DETAILED DESCRIPTION OF THE PREFERRED EMBODIMENT

Figure 7:
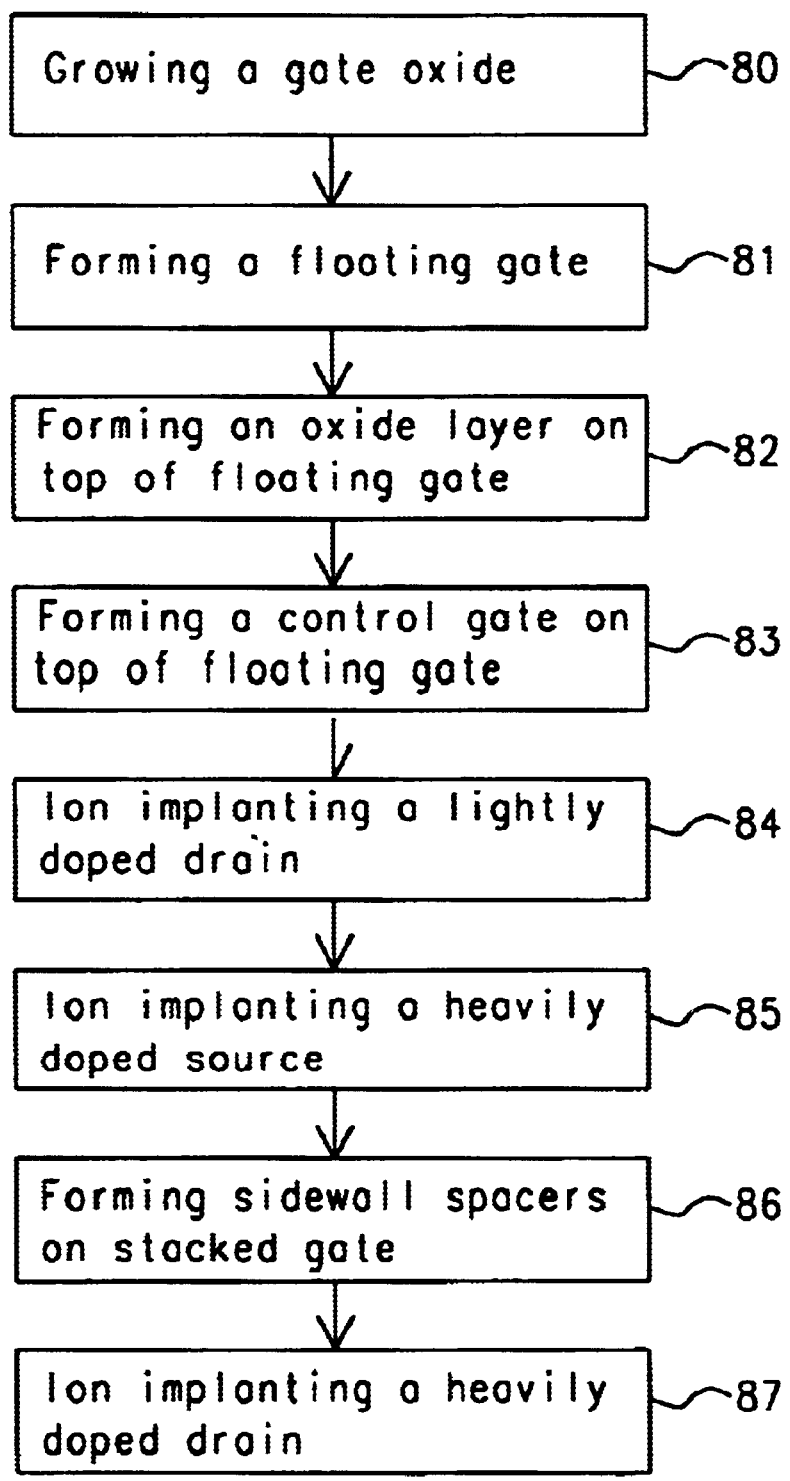
FIG. 7 is a method to produce the stacked gate flash memory cell of this invention.

In FIG. 1 is shown a cross sectional view of the stacked gate flash memory cell of this invention. A floating gate 10 is formed on a gate oxide 11 grown on a semiconductor substrate 14. On top of the floating gate 10 is a control gate 12 separated from the floating gate by an oxide 13. Sidewalls 15 are formed on the stacked gate comprising the floating gate 10 and control gate 12. Implanted in the semiconductor substrate 14 is an N+ drain 16 extending under a sidewall 15 to a region under the edge of one side of the floating gate 10. On the opposite side of the floating gate 10 an N− lightly doped drain (LDD) 17 is implanted into the semiconductor substrate extending under the sidewall 15 to a region under the edge of the opposite side of the floating gate 10. Both the N+ source 16 and the N-LDD 17 were implanted into the substrate before the sidewalls 15 were formed on the sides of the stacked floating gate 10 and control gate 12. After the sidewalls 15 are formed an N+ drain 18 is implanted into the semiconductor substrate 14. As a [of] result of the N− LDD 17, the electric field of the drain junction is reduced which reduces the hot electron generation at the drain and reduces the bit line disturb conditions during program operations.

In FIG. 2a a schematic of bias conditions for a read operation is shown for prior art. Here a stacked gate transistor flash memory cell 20 is biased with IV connected to the drain 21, Vcc connected to the control gate 22 by means of a wordline (not shown for simplicity), and ground connected to the source 23 through a source line (not shown for simplicity). The resistance Rs represents the resistance of the source line. In FIG. 2b is shown the stacked gate flash memory cell of this invention biased in a read mode. The stacked gate transistor 30 is biased similar to the transistor 20 of prior art shown in FIG. 2a. The control gate 32 is biased to Vcc through a connecting wordline (not shown for simplicity) and the source 33 is biased to ground through a connecting source line (not shown for simplicity) where the source line resistance is Rs. The drain 31 is biased greater than 1.5 volts as a result of the low concentration ions in the drain junction resulting from the N-LDD 17 which allows a stronger bit current to reduce read errors and improve read speed. Alternatively, the increased drain voltage can allow a longer and/or a more resistive bit line to be used.

In FIG. 3a is shown a stacked gate flash memory cell of prior art biased in program mode. The stacked gate transistor 40 is biased to +5V on the drain 41, to +9V on the control gate 42, and to ground on the source 43 through a source line with a resistance of Rs. A current IDS flows through the stacked gate transistor 40. In comparison the stacked gate transistor 50 of the flash memory cell of this invention is shown in FIG. 3b. The drain 51 is connected to 0V through a bit line (not shown for simplicity), the control gate is biased to +9V through a wordline (not shown for simplicity), and the source 53 is biased to +5V through a source line (not shown for simplicity) where Rs represents the resistance of the source line. The current $I_{SD}$ Flows in an opposite direction compared to that in the transistor 40 of prior art. Even though the drain junction 17 of the stacked gate transistor 50 in FIG. 3b sees the floating gate, the low concentration of ions in the LDD does not allow an efficient generation of hot electrons for programming the floating gate 54 of the stacked gate transistor 50. The stacked gate of prior art shown in FIG. 3a uses the drain 41 for hot electron programming and the source 43 for Fowler-Nordheim (FN) tunneling for erase operations. The stacked gate flash memory cell of this invention shown in FIG. 3b uses the source 53 for both hot electron programming and FN tunneling for erasing. The gate to source voltage $V_{GS}=9-(5-I_{SD}*R_S)$ for this invention show in FIG. 3b as compared to $V_{GS}=9-I_{DS}*R_S$ for the prior art shown in FIG. 3a. Thus the present invention has a higher gate to source voltage that can be used to improve program speed. Alternately, the potential for increased gate to source voltage can be used to allow a reduced gate voltage which in turn can simplify high voltage design, reduce junction leakage and improve gate disturb.

In FIG. 4 is shown a circuit diagram for illustrating a soft program disturb that can occur in this invention. An unselected flash memory cell 60 is partially biased in a program mode by applying +9V to the control gate 58 by means of a selected wordline and +5V to the source 59 by means of a selected source line. The drain 57 is biased to +5V which deselects cell for programming. When +5V is applied to the unselected bit line 56, the capacitance $C_{BL}$ of the unselected bit line 56 is charged to +5V. During charging of the unselected bit line 56 to +5V, a transient current can flow in the unselected memory cell 60. In order to reduce the disturb effects of this transient current, the bit line 56 is pre-charged to $V_{cc}$ which minimizes the disturb condition to $5-V_{cc}$ and a total charge time of less than 0.5us. However, the +5V on the unselected bit line 56 will cause a bit line disturb on cell 61, shown in FIG. 5. To minimize this disturb condition the drain side 63 of the stacked gate device 61 is engineered to reduce hot carrier generation by means of an LDD 17 shown in FIG. 1.

Continuing to refer to FIG. 5, a small portion of the matrix of interconnected flash memory cells are shown. A selected bit line BL0 55 connects a voltage of 0V to the drain 51 connected to the selected cell 50 and to the drain 64 of an unselected cell 62. An unselected bit line BL1 56 connects a voltage of 5V to the drain 57 connected to the selected cell 60 and to the drain 66 of an unselected cell 61. A selected word line WL0 connects +9V to the control gate 52 of the selected cell 50 and to the control gate 58 of an unselected cell 60. A selected source line SL0 connects +5V to the source 53 of the selected stacked gate flash memory cell 50, to the source 65 of an unselected cell 62 connected to the selected bit line BL0 55, to the source 59 of unselected cell 60 and source 66 of unselected cell 61. An unselected wordline WL1 connects 0V to the gate 67 of the unselected cell 62 and gate 68 of the unselected cell 61. Besides the disturb condition on cell 61 noted above and caused by the +5V bit line voltage on BL1, a wordline disturb can occur on cell 60, but this disturb condition is minimized because the +5V on the bit line BL1 and the +5V on the selected source line SL0 maintain a small channel differential on cell 60. A source line disturb can occur on unselected cell 62 where the selected source line SL0 provides +5V to the source 65 of cell 62. The gate 67 of cell 62 is bias to 0V by the unselected wordline WL1 and the drain 64 is biased by the selected bit line BL0. The source line disturb condition on cell 62 is similar to bit line program disturb found in prior art.

In FIG. 6a is shown the erase configuration for a stacked gate flash memory cell 40 of prior art. In order to erase information stored on the floating gate of cell 40, a bit line (not shown for simplicity) connects a floating line or 0V to the drain 41, a wordline (not shown for simplicity) connects −9V to the gate 42 and a source line (not shown for simplicity) connects +5V to the source 43 of cell 40 where Rs is the resistance of the source line. In FIG. 6b is shown the erase configuration for a stacked gate flash memory cell 40 of this invention. The configuration to erase information stored on the floating gate of cell 50 is similar to that of prior art where a bit line (not shown for simplicity) connects a floating line or 0V to the drain 51, a wordline (not shown for simplicity) connects −9V to the gate 52 and a source line (not shown for simplicity) connects +5V to the source 53 of cell 50 where Rs is the resistance of the source line.

In FIG. 7 is shown a method to produce the stacked gate-flash-memory-cell-of this invention. A gate oxide is grown on the surface of a semiconductor substrate 80, and a floating gate is formed on top of the gate oxide 81. Next an oxide layer is formed on top of the floating gate 82, which is used to separate the floating gate from a control gate, which is formed on top of the floating gate 83. A lightly doped drain is ion implanted into the semiconductor substrate 84 on the drain side of the gate structure. A heavily doped source is implanted on the source side of the gate structure 85 and sidewall spacers are formed on the sides of the gate structure 86. After the sidewalls are formed a heavily doped drain is ion implanted into the semiconductor substrate 87 interfacing the lightly doped drain implanted in step 84.

While the invention has been particularly shown and described with reference to preferred embodiments thereof, it will be understood by those skilled in the art that various changes in form and details may be made without departing from the spirit and scope of the invention.

What is claimed is:

1. A method of producing a stacked gate flash memory cell to reduce disturb conditions, comprising:
    a) growing a gate oxide on top of a semiconductor substrate,
    b) forming a floating gate on top of said gate oxide,
    c) forming an upper oxide layer on top of said floating gate,
    d) forming a control gate on top of said floating gate with said upper oxide layer in between to produce a stacked gate,
    e) forming an LDD (lightly doped drain) in said substrate only on drain side of said stacked gate using said stacked gate as a mask,
    f) forming a source that is heavily doped in said substrate using said stacked gate as a mask,
    g) forming sidewall spacers on sides of said stacked gate of an insulating material, then
    h) forming a drain that is heavily doped in said substrate using a sidewall spacer located on the sidewalls of the stacked gate as a mask.

* * * * *